United States Patent
Kang et al.

[11] Patent Number: 5,837,119
[45] Date of Patent: Nov. 17, 1998

[54] METHODS OF FABRICATING DENDRITIC POWDER MATERIALS FOR HIGH CONDUCTIVITY PASTE APPLICATIONS

[75] Inventors: Sung Kwon Kang, Chappagua; Sampath Purushothaman, Yorktown Heights; George Frederick Walker, New York, all of N.Y.

[73] Assignee: International Business Machines Corporation, Armonk, N.Y.

[21] Appl. No.: 689,553

[22] Filed: Aug. 9, 1996

Related U.S. Application Data

[63] Continuation of Ser. No. 414,063, Mar. 31, 1995, abandoned.

[51] Int. Cl.$^6$ .................................................. C25C 5/02
[52] U.S. Cl. ............................ 205/74; 205/111; 205/170; 205/191
[58] Field of Search ............................ 205/74, 111, 170, 205/144, 191; 228/203, 248.1, 248.5; 252/512

[56] References Cited

U.S. PATENT DOCUMENTS

| | | | |
|---|---|---|---|
| 4,789,411 | 12/1988 | Eguchi | 148/24 |
| 4,888,135 | 12/1989 | Tsunaga | 252/512 |
| 5,062,896 | 11/1991 | Huang et al. | 106/287.19 |
| 5,136,365 | 8/1992 | Pennisi et al. | 357/72 |
| 5,213,715 | 5/1993 | Patterson et al. | 252/518 |
| 5,286,417 | 2/1994 | Mahmoud et al. | 252/518 |

FOREIGN PATENT DOCUMENTS

| | | |
|---|---|---|
| 57-113505 | 7/1982 | Japan . |
| 217726 | 8/1993 | Japan . |
| 5-217726 | 8/1993 | Japan . |

OTHER PUBLICATIONS

K.L. Popov et al., "The Critical Overpotential for Copper Dendrite Formation", J. App. Electrochem., vol. 9, pp. 527–531 (1979).

K.L. Popov et al., "The Mechanism of Copper Powder Formation in Potentiostatic Deposition", J. App. Electrochem., vol. 10, pp. 299–308 (1980).

K.L. Popov et al., "Dendritic Electrocrystallization and the Mechanism of Powder Formation in the Potentiostatic Electrodeposition of Metals", J. App. Electrochem., Vol. II, pp. 239–246 (1981).

D. Russev, "An Electron Microscope Investigation of Electrolytic Copper Powders", J. App. Electrochem, vol. II, pp. 177–185 (1981).

R. Walker, et al., "The Morphology and Properties of Electrodeposited Copper Powder," Surface Technology, 23(1984) 301–321, Jun. 1984.

*Primary Examiner*—John Niebling
*Assistant Examiner*—Brendan Mee
*Attorney, Agent, or Firm*—Daniel P. Morris

[57] ABSTRACT

Methods for forming pastes of dendrites particles coated with an electrically conductive coating are described. A surface is placed in contact with an electrolytic or electroless plating solution. Dendrites are formed on the surface. The dendrites are exposed to another plating solution to plate a coating on the surface of the dendrites. The coated dendrites are removed from the surface to form a powder of coated dendrites. The powder is added to a polymer material to form a paste which is heated to fuse the dendrite surfaces to form a network of interconnected dendrites and further heated to cure the polymer. When the paste is disposed between adjacent electrically conductive surfaces, the coated dendrites fuse to the electrically conductive surface to form electrical interconnections.

28 Claims, 5 Drawing Sheets

METHODS OF FABRICATING DENDRITIC POWDER MATERIALS FOR HIGH CONDUCTIVITY PASTE APPLICATIONS

This is a continuation of application Ser. No. 08/414,063, filed Mar. 31, 1995, and now abandoned.

FIELD OF THE INVENTION

The present invention is directed to method of producing dendrite powders useful in pastes for forming electroconductive connections between electroconductive members, and methods of use in electronic applications.

BACKGROUND

Most electrical conductors used in electronic devices are made of metals, such as copper, aluminum, gold, silver, lead/tin (solder), molybdenum and others. Solder connection technology using lead/tin alloys plays a key role in various levels of electronic packaging, such as flip-chip connection (or C4), solder-ball connection in ball-grid-arrays (BGA), and IC package assembly to a printed circuit board (PCB). Solder joints produced in the electronic packages serve critically as electrical interconnections as well as mechanical/physical connections. When either of the functions is not achieved, the solder joint is considered to have failed, which can often threaten a shut-down of the whole electronic system.

When microelectronic packages are assembled to a printed circuit board, the lead-tin eutectic solder, 63% Sn-37% Pb, having the lowest melting point (183° C.) among Pb—Sn alloys, is most widely used. In these applications, there are two solder connection technologies employed for mass production: plated-through-hole (PTH) and surface mount technology (SMT) soldering. The basic difference between the two technologies originates from the difference in the PCB design and its interconnection scheme.

In SMT soldering, microelectronic packages are directly attached to the surface of a PCB. A major advantage of SMT is high packaging density, which is realized by eliminating most PTH's in the PCB as well as by utilizing both surfaces of the PCB to accommodate components. In addition, SMT packages have a finer lead pitch and a smaller package size compared to traditional PTH packages. Hence, SMT has contributed significantly in reducing the size of electronic packages and thereby the volume of the overall system.

In SMT soldering, solder paste is applied to a PCB by screen printing. Solder paste consists of fine solder powder, flux, and organic vehicles. During the reflow process, solder particles are melted, flux is activated, solvent materials are evaporated, and simultaneously molten solder coalesces and is eventually solidified. In contrast, in the wave solder process, a PCB is first fluxed and components are mounted on it. Then it is moved over a wave of molten solder to achieve wetting and soldering.

The soldering process is usually completed by subjecting the solder joints to a cleaning step to remove residual flux materials. Due to environmental concerns, CFCs (chlorofluoro carbons) and other harmful cleaning agents used for this purpose are being eliminated and water-soluble or no-clean flux materials are being used to minimize or eliminate the cleaning steps.

Recent advances in microelectronic devices demand a very fine pitch connection between electronic packages and a printed circuit board (in an order of a few hundred micrometer pitch). The current solder paste technology used in SMT can not handle this very fine pitch interconnection due to the soldering defects such as bridging or solder balling. Another technical limitation of using the Pb—Sn eutectic solder is its high reflow temperature, approximately 215° C. This temperature is already higher than the glass transition temperature of the epoxy resin used in most polymeric printed circuit board materials. Thermal exposure at this reflow temperature produces significant thermal strains in a printed circuit board after soldering, especially in the direction perpendicular to the surface of a PCB, because no structural reinforcement is made in that direction. Thereby, the residual thermal strains in an assembled PCB could significantly degrade the reliability of an electronic system.

A more serious concern regarding the usage of lead (Pb)-containing solders is an environmental issue, a trend/ impact already experienced in other industries and has lead to the elimination of lead from gasoline and paints.

In the electronic industry, two different groups of materials are investigated currently for the possibility of substituting the Pb-containing solder materials; Pb-free solder alloys, and electrically conductive pastes (ECP). The present invention discusses the development and applications of the electrically conductive paste materials. An electrically conductive paste (or adhesive) is made of metallic filler particles loaded in the matrix of a polymer material. The polymer matrix can be any polymer suitable for use in a paste, for example, a thermoplastic or thermoset. The polymer is preferably an epoxy, polyester polyimide siloxane, and polyimide. The soluble epoxy, in particular, soluble ketal and acetal diepoxides, as described in U.S. application Ser. No. 08/210,879, the teaching of which is incorporated herein by reference. Referring to FIG. 1, silver-particle 2 filled epoxy 4 is the most common example of the electrically conductive pastes 6, schematically shown therein as disposed between surface 8 and surface 10. The silver particles usually in the shape of flakes provide electrical conduction by percolation mechanism, while the epoxy matrix provides adhesive bond between the components and a substrate. This silver-filled epoxy material has been long used in the electronic applications as a die-bonding material, where its good thermal conduction rather than electrical conduction property is utilized. However, this material has not been accepted for the applications requiring high electroconduction and fine pitch connection. The silver-filled epoxy material has several limitations, such as low electrical conductivity, increase in contact resistance during thermal exposure, low joint strength, silver migration, difficulty in rework, and others. Since this silver-filled epoxy material electrically conductive in all the directions, it is classified as "isotropic" in electro-conduction. There is another class of electrically conductive adhesive (or film), which provides electroconduction only in one direction. This class of the materials is known as "anisotropic" conductive adhesive film 12, shown schematically in FIG. 2A, which contains electrically conductive particles 14 in a binder or adhesive material 16. The anisotropic conductive adhesive or film 12 becomes conductive only when it is compressed between two conducting surfaces 18 and 20 as shown in FIG. 2B. This process requires normally heat and pressure. The major application of the anisotropic conductive film is for joining of a liquid crystal display panel to its electronic printed circuit board. The conducting particles 14 are usually deformable, such as solder balls, or plastic balls coated with nickel and gold. The binder or adhesive material 16 is mostly a thermosetting resin.

The ECP made of Sn-plated Cu powder and polyimide-siloxane resin is a good candidate for the high temperature solder joints such as controlled collapse chip connections (C4) and solder ball connection (SBC) to a ceramic substrate. However, for the polymeric printed circuit board applications, this ECP is not adequate, because the reflow temperature such as 250° C. is much higher than the glass transition temperature of the polymeric resin, for example, FR-4. A candidate for this purpose is an ECP made of Indium-plated Cu powder formulated with polyimide-siloxane resin. The reflow temperature of the Indium-plated Cu powder paste is expected to be about 180° C., which is even lower than the reflow temperature of the Pb/Sn eutectic solder, 215° C.

A solder/polymer composite paste material is disclosed in U.S. Pat. No. 5,062,896 (Huang et. al.), comprising a major proportion of a meltable solder powder filler, such as Bi—Sn, Pb—Sn, Bi—Sn—Pb alloys, a minor proportion of a thermoplastic polymer such as a polyimide siloxane, and a minor proportion of a fluxing agent. An oxide-free partially coalesced solder alloy connection is obtained, which is polymer strengthened and reworkable at a low reflow temperature, per se, or in the presence of polymer solvent.

In U.S. Pat. No. 5,286,417 (Mahmoud et. al.), a fusible conductive adhesive is disclosed, which comprises metal alloy fillers such as Sn—Au and Bi—Au, and a thermoplastic polymer having a glass transition temperature overlapping the melting temperature of the metal filler alloys. The loading of the conductive material in the polymer is in the range of about 15% to about 20% by weight.

In U.S. Pat. No. 5,136,365 (Pennisi et. al.), an adhesive material is disclosed, which contains a fluxing agent and metal particles for use in reflow soldering such as Sn, Pb, In, Bi, Sb, Ag and others, in the matrix of an epoxy resin. Upon reflow soldering, the said adhesive forms anisotropic electroconduction between an electrical component and a substrate.

In U.S. Pat. No. 5,213,715 (Patterson, et. al.), a directionally conductive polymer is disclosed, which contains a metallic filler powder of Ni or Cu. The metallic powder is treated by a different polymer than the polymer used as a matrix resin. Upon compression, the coated polymer dissolves to make an electrical conduction among the filler particles.

OBJECTS

It is an object of the present invention to provide a method of fabricating an electrically conductive paste material which is environmentally safe and low cost.

It is another object of the present invention to provide a method of fabricating an electrically conductive paste material which produces a higher electrical conductivity than the conventional silver-filled epoxy systems.

It is another object of the present invention to provide a method of fabricating an electrically conductive paste material which can be processed at a lower temperature than the reflow temperature of Pb—Sn eutective solder paste.

BRIEF DESCRIPTION OF THE DRAWINGS

Further objects, features, and advantages of the present invention will become apparent from a consideration of the following detailed description of the invention when read in conjunction with the drawing FIGs., in which.

SUMMARY OF THE INVENTION

A broad aspect of the present invention is a method including the steps of disposing a platable surface in contact with a first plating solution; growing dendrites on said surface from the first plating solution; and forming on the dendrites a coating to form coated dendrites.

In a more particular aspect of a method of the present invention, the dendrites are coated with an electrically conductive material.

In a more particular aspect of a method of the present invention, the coated dendrites are removed from the platable surface to form a powder of coated dendrites.

DETAILED DESCRIPTION

Figure 1:
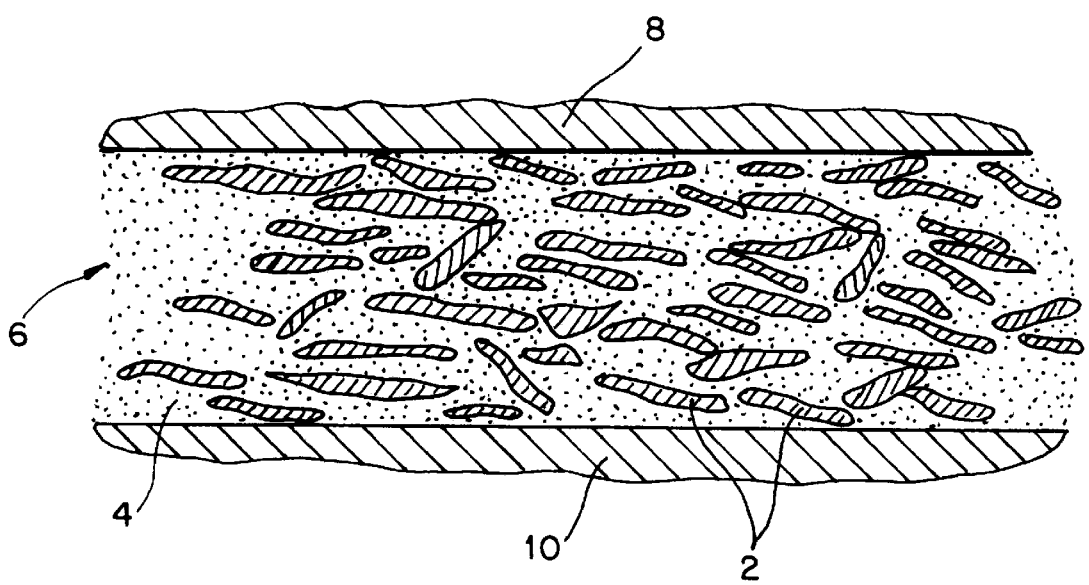
FIG. 1 is a schematic illustration of an electrically conductive paste comprising silver flake particles as a filter in the matrix of epoxy resin. The conductive paste is classified as isotropic in electroconduction.
Figure 2A:
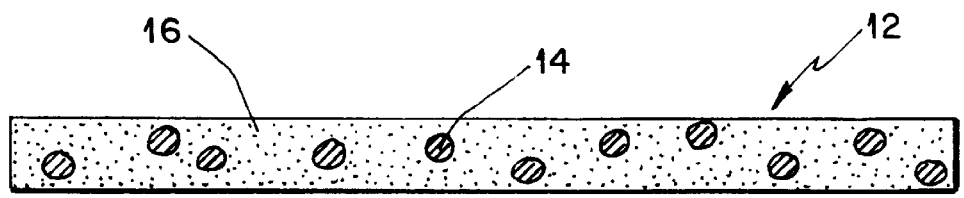
FIG. 2 is a schematic illustration of an electrically conductive adhesive which becomes electrically conductive only in one direction when the adhesive film is compressed between two contact or bond pads. The conductive adhesive (or film) is classified as anisotropic.
Figure 2B:
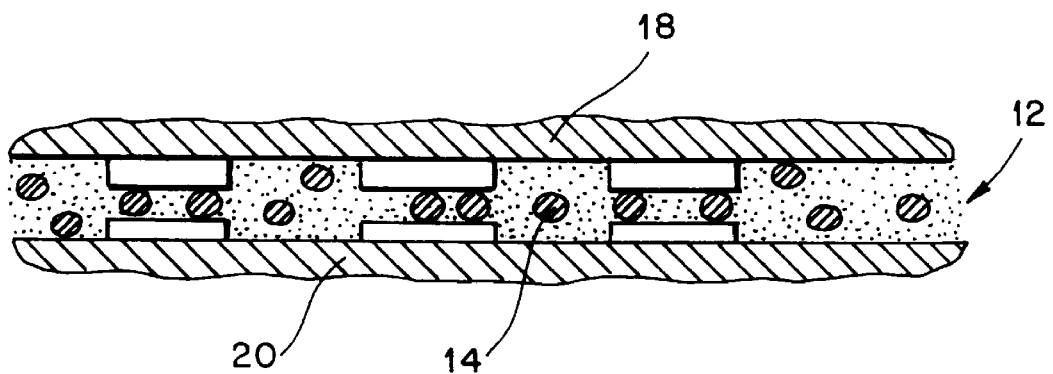
Figure 3:
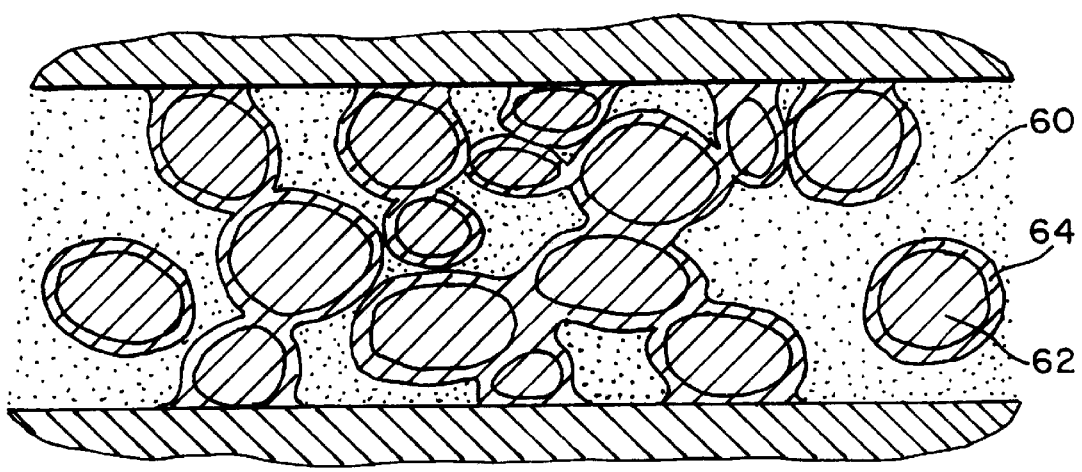
FIG. 3 is a schematic illustration of an electrically conductive paste material, comprising spherical copper powder filled in the matrix of thermoplastic polymer resin. The copper particles are coated with a low melting point, non-toxic metal, such as tin, indium, bismuth, or combinations thereof.

According to an embodiment of the present invention, an electrically conductive paste (ECP) material is disclosed, which consists of copper powder coated with a thin layer of low melting point, Pb-free metals, such as Sn, In, Bi, Sb and their alloys, mixed with an environmentally-safe fluxing agent, and dispersed in the matrix of thermoplastic or thermosetting polymers. The microstructure of the ECP containing Sn-coated Cu powder is shown in its cross-section view in FIG. 3.

In one particular embodiment, we disclose a new electrically conductive paste material consisting of indium-coated copper powder, polyimide-siloxane, solvent (NMP), no clean flux, and carboxylic acid/surfactant. The indium-coated copper powder is produced by a sequential electrodeposition of copper dendrite powder on a dummy substrate, followed by another electrodeposition of indium on the copper dendrite powder. The copper dendrite powder can be replaced by other dendritic powders such as nickel, cobalt, chromium, palladium, platinum, and others. The indium can be replaced by other metals such as Sn, Zn, Pb, Bi and Sb or their alloys. Because the dendritic powder has a large aspect ratio, it has an advantage of better electrical and/or thermal conduction characteristics in comparison to the spherical powder. A joining operation can be performed near the melting point of In, 157° C., where a metallurgical bonding of In-to-In or In-to-Au or In-to-Cu is accomplished at the dendritic particle-to-particle as well as dendritic particle-to-substrate pad interfaces. Since indium metal and alloys have an excellent wetability on the metals that are hard to solder to, such as aluminum, titanium, molybdenum, or tungsten, the present invention material can be used for joining of liquid crystal display devices. The joining process can be either solid-state or liquid-solid reaction. The polymer curing process can be combined with the joining process depending on the paste formulation. Because of the metallurgical bonding and the high conductivity copper core, a higher electrical conductivity is expected with the joints made of the new paste material than with those of the silver-epoxy material. The metallurgical bonds also provide stable electrical conductivity of the new joints upon thermal exposure and cycling. It is also expected to have a higher joint strength from the combined effect of the metallurgical and adhesive bonds.

The polymer component of the paste can be polymer resins prepared from renewable resources or bio-based materials after appropriate functionalization to achieve the desirable thermal and rheological properties. Lignin (by product from paper manufacture), cellulose, wood or crop oils are potential candidates for this purpose. Use of these materials is environmentally preferable because they are derived from natural and renewable resources and can be disposed of more readily at the end of the useful life of the electronic assembly. This is particularly attractive because the use of the Cu—In powder eliminates the use of lead (Pb) containing solders and the resulting paste formulation is non-toxic and easy to dispose.

Our previous application Ser. No. 326,626, filed on Oct. 24, 1994, the teaching of which is incorporated herein by reference teaches using tin-coated copper powder as a filler material in formulating an electrically conductive paste. The copper powder has a spherical morphology, which can be produced by either powder atomization or electrodeposition process. Tin coating is performed on copper powder by using tin immersion plating solution. To obtain a uniform coating of tin metal, the surface oxide film on the copper powder is preferably carefully cleaned. In addition, handling of fine powder during the wet processes such as etching, cleaning, rinsing, filtering and drying is not trivial, and is mostly time consuming.

A spherical morphology of the copper powder has certain disadvantages. For better electrical conduction at a minimum loading of the filler materials, a powder morphology with a high aspect ratio such as flake- or plate-shape, is desirable.

Since there is no immersion plating process available for indium metal, indium coating on copper powder similar to the process of tin-coating on copper powder described above is not possible.

The process and structure of the present invention provides the solution to the problems of a powder of spherical particles and the coating of indium metal.

Figure 4:
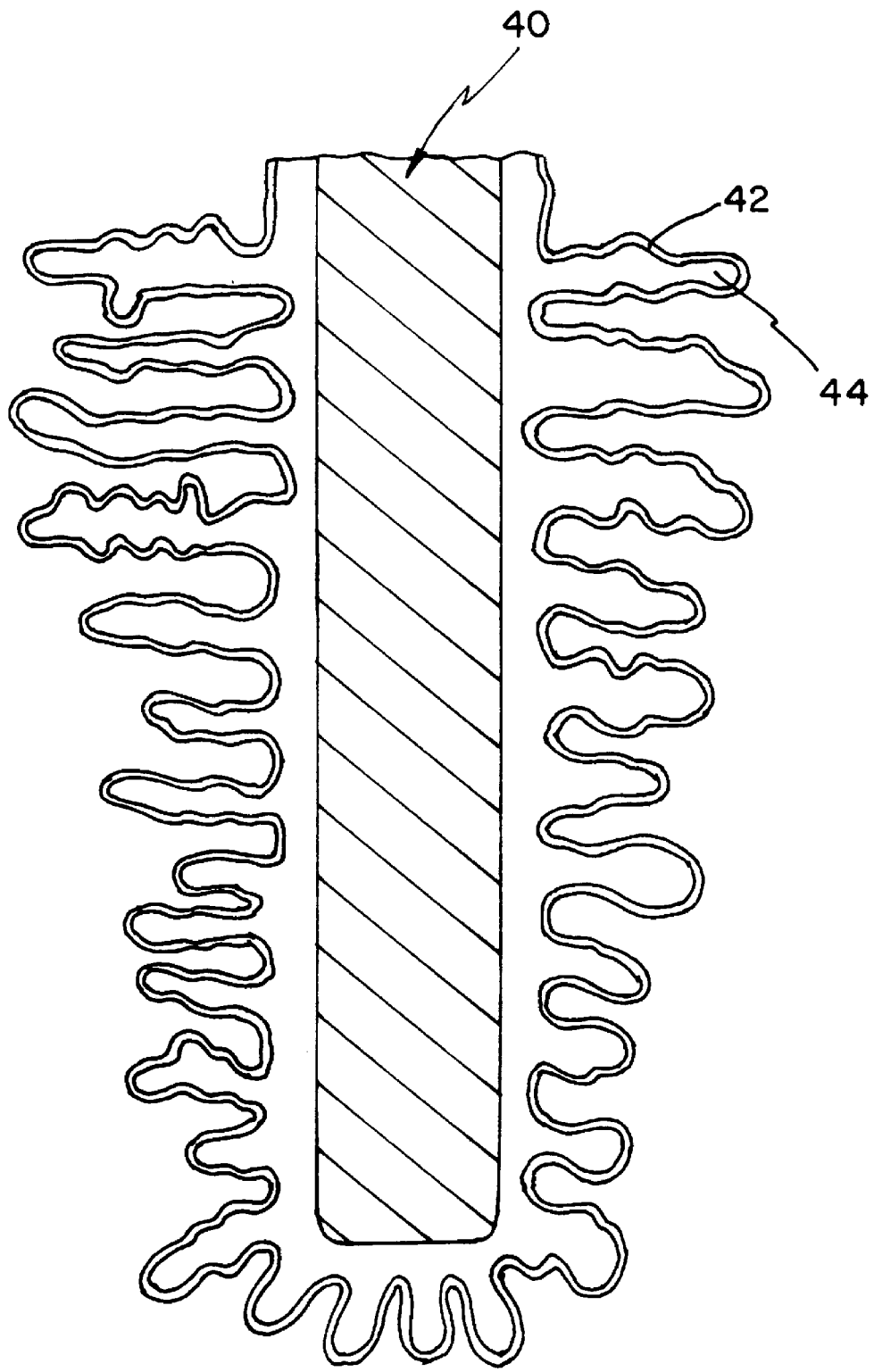
FIG. 4 is a schematic illustration of the dendritic copper powder deposited on a dummy substrate, followed by electrolytic deposition of a thin layer of indium metal on the dendritic powder.
Figure 5A:
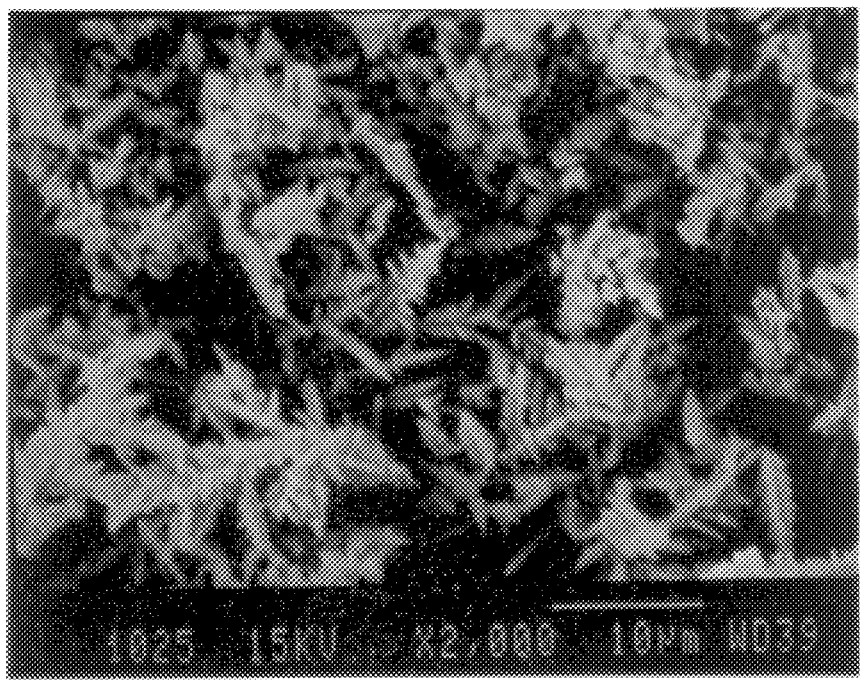
FIG. 5 is a SEM (scanning electron micrograph) of the structure schematically shown in FIG. 4.
Figure 5B:
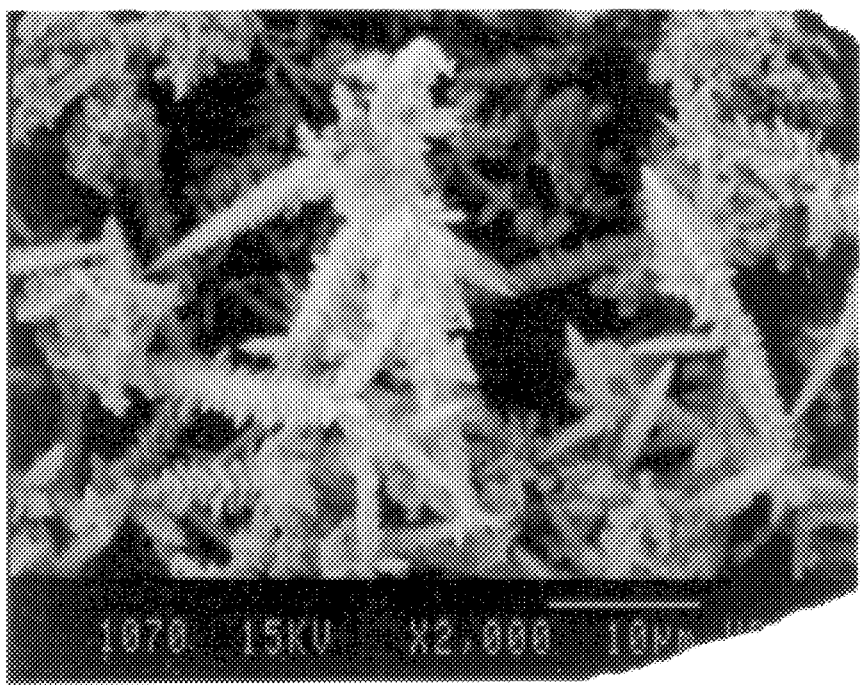

FIG. 4 illustrates schematically the copper dendrite structure deposited on a dummy substrate 40, followed by an electrodeposition of thin indium metal 42 on top of the copper dendrite structure 44. The indium-coated copper dendrite powder can be easily collected by scraping from the dummy substrate using a knife edge. The general conditions for producing copper dendrites by electrodeposition are well known in the literature, as supplied, for example, in the references cited in the Background Section. FIG. 5 shows an SEM of a copper dendrite structure produced according to the present invention. The plating solution used consists of 79 gm of $CuSO_4 5H_2O$, 200 gm of $H_2SO_4$ (or 109 ml), 0.116 ml of HCl, and 1 liter of $H_2O$. The anode is oxygen-free copper foil of 4"×10"×0.015". The cathode material is a copper or nickel rod of $\frac{1}{8}$" diameter. To produce a desired dendrite structure on the cathode rod, three-stage plating scheme is required; (i) initial plating of dense copper, (ii) dendrite nucleation stage, and (iii) dendrite growth stage. A typical example of the three-stage plating conditions are as follows;

i) initial plating; 0.05–0.1 $A/in^2$(0.1–0.2 V) for 0.02 Ah (about 3 min)

ii) dendrite nucleation; 0.5–1.0 $A/in^2$(0.8–1.2 V) for 0.1 Ah (1–2 min)

iii) dendrite growth; 0.1–0.2 $A/in^2$(0.3–0.7 V) for 0.1 Ah (5 min).

Indium plating is performed immediately after the copper dendrite is deposited by transferring the substrate rod to a rinsing bath and then to an indium plating bath. The indium plating is done at room temperature by using an indium sulfamate solution obtained from the Arconium Specialty Alloys, Providence R.I. A typical indium plating condition is: 0.05–0.1 $A/in^2$(0.1 V) for 0.03 Ah (about 3 min).

The process described here for production of indium-coated copper dendrite powder has several advantages over the tin-coated copper powder of spherical morphology. First, this is the only process to deposit indium metal on fine copper powder for the electrically conductive paste applications. Secondly, this process eliminates the production of spherical copper powder by a separate process, and eliminates the powder handling processes such as etching, cleaning, filtering, rinsing, and drying. Thirdly, since the indium plating can be performed immediately after copper dendrite growth, it reduces the possibility of forming copper oxide on the surface of an exposed copper powder or dendrite. Fourth, this process produces copper dendrite structure which has a larger aspect ratio than the spherical powder used in the present invention. This will result in enhanced electrical/thermal conductivity when this material is incorporated in the form of conductive paste materials. Lastly, the major advantage of the indium-plated copper dendrite material is that it is the only filler material with high electrical conductivity available for the low temperature assembly where it can be used with the FR-4 type polymeric substrates. Since indium has good wetability to even ceramic-type materials, this material can be used for the conducting pads normally not wetted by solders, such as aluminum, titanium, chromium, molybdenum, tungsten, and their oxides.

While the present invention has been described with respect to preferred embodiments, numerous modifications, changes, and improvements will occur to those skilled in the art without departing from the spirit and scope of the invention.

What is claimed is:

1. A method comprising the steps of:

disposing a platable surface in contact with a first plating solution;

growing copper dendrites on said surface from said first plating solution in a three stage process comprising initial plating of dense copper, dendrite nucleation and dendrite growth;

wherein said dendrite growth is conducted at a different current density than said dendrite nucleation;

forming on said copper dendrites a coating to form coated dendrites, said coating having a lower melting temperature than said copper dendrites;

removing said dendrites from said platable surface;

heating a group of said coated dendrites to a temperature sufficient to fuse said coating between adjacent coated dendrites, said temperature being insufficient to melt said copper.

2. A method according to claim 1, wherein said first plating solution is an electroplating solution.

3. A method according to claim 1, wherein said coating is formed from a second plating solution selected from the group consisting of an electroless plating solution and an immersion plating solution and an electroplating solution.

4. A method according to claim 1, wherein said platable surface is electrically conductive.

5. A method according to claim 1, wherein said dendrites have a central portion and branched portions extending away from said central portion.

6. A method according to claim 1, wherein said step of removing comprises shaving said dendrites from said surface.

7. A method according to claim 1, wherein said dendrites are formed from an electrically conductive material.

8. A method according to claim 7, wherein said electrically conductive material is selected from the group consisting of Cu, Pd, Pt, Ni, Ag, and Au.

9. A method according to claim 1, wherein said coating is electrically conductive and is formed by immersing said dendrites in a second plating solution.

10. A method according to claim 9, wherein said second plating solution is an electroplating solution.

11. A method according to claim 9, wherein said second plating solution is selected from the group consisting of an electroless plating solution and an immersion plating solution.

12. A method according to claim 1, wherein when said surface is exposed to said first plating solution; a first voltage is applied to said surface to plate said dendrites on said surface; and when said dendrites are exposed to said second plating solution a second voltage is applied to said dendrites to plate said coating on said dendrites.

13. A method according to claim 1, wherein said coating is selected from the group consisting of Sn, Zn, In, Bi, Pb, Au, and Sb.

14. A method according to claim 1 further including adding said coated dendrites to a polymeric material to form a paste.

15. A method according to claim 1, wherein said polymeric material is selected from the group consisting of polyimides, siloxanes, epoxies, bio-based resins made from lignin, cellulose, wood oils and crop oils.

16. A method according to claim 14, wherein said paste is disposed between a first and second electrically conductive surface.

17. A method according to claim 16, wherein said first electrically conductive surface is a chip contact location and said second electrically conductive surface is a substrate contact location.

18. A method according to claim 16, wherein said first electrically conducting surface is a liquid crystal display panel contact location and said second electrically conductive surface is a chip carrier tape lead location.

19. A method according to claim 14, wherein said paste is heated to a first temperature to fuse said coating on adjacent dendrites.

20. A method according to claim 14, wherein said paste is heated to a second temperature sufficient to cure said polymer.

21. A method according to claim 1 wherein said coating is electrically conductive.

22. A method according to claim 14, wherein said polymeric material is a soluble epoxy.

23. A method according to claim 1 wherein:

said initial plating is at from 0.05 to about 0.1 A/in$^2$ at from 0.1 to about 0.1 V for about 0.02 Ah;

said dendrite nucleation at from 0.5 to about 1.0 A/in$^2$ at from 0.8 to about 1.2 V for about 0.1 Ah;

said dendrite growth at from 0.1 to about 0.2 A/in$^2$ at from 0.2 to about 0.7 V for about 0.1 Ah.

24. A method according to claim 1 wherein said coating is indium.

25. A method comprising the steps of:

disposing a platable surface in contact with a first plating solution;

growing dendrites on said surface from said first plating solution in a three stage process comprising initial plating of a dense coating, dendrite nucleation and dendrite growth;

wherein said dendrite growth is conducted at a different current density than said dendrite nucleation;

forming on said dendrites a coating to form coated dendrites, said coating having a lower melting temperature than said dendrites;

removing said dendrites from said platable surface.

26. A method according to claim 25 wherein:

said initial plating is at from 0.05 to about 0.1 A/in$^2$ at from 0.1 to about 0.1 V for about 0.02 Ah;

said dendrite nucleation at from 0.5 to about 1.0 A/in$^2$ at from 0.8 to about 1.2 V for about 0.1 Ah;

said dendrite growth at from 0.1 to about 0.2 A/in$^2$ at from 0.2 to about 0.7 V for about 0.1 Ah.

27. A method according to claim 25 further including heating a group of said coated dendrites to a temperature sufficient to fuse said coating between adjacent coated dendrites, said temperature being insufficient to melt said copper.

28. A method according to claim 25 wherein said coating is indium.

* * * * *